United States Patent [19]

Nowara

[11] Patent Number: 5,974,087
[45] Date of Patent: Oct. 26, 1999

[54] WAVEFORM QUALITY MEASURING METHOD AND APPARATUS

[75] Inventor: Kenji Nowara, Okegawa, Japan

[73] Assignee: Advantest Corporation, Tokyo, Japan

[21] Appl. No.: 08/982,637

[22] Filed: Dec. 2, 1997

[30] Foreign Application Priority Data

Apr. 12, 1996 [JP] Japan .................................. 8-324294
Jun. 12, 1996 [JP] Japan .................................. 8-326311

[51] Int. Cl.$^6$ ............................. H04B 17/00; H04B 3/46; H04K 1/00; H04L 7/00
[52] U.S. Cl. ........................ 375/226; 375/200; 375/371; 375/329
[58] Field of Search ................................. 375/226, 371, 375/375, 316, 227, 200, 261, 269, 279, 340, 280, 281, 324, 329, 332; 455/67.1, 67.3, 67.6; 370/320, 335, 332, 342, 441; 329/304

[56] References Cited

U.S. PATENT DOCUMENTS 4,542,514  9/1985  Watanabe .............................. 375/226
5,187,719  2/1993  Birgenheier et al. ................... 375/226
5,799,038  8/1998  Nowara et al. ......................... 375/226

Primary Examiner—Stephen Chin
Assistant Examiner—Betsy L. Deppe
Attorney, Agent, or Firm—Staas & Halsey, LLP

[57] ABSTRACT

A complex base band signal b of a send signal from a mobile station of the CDMA system is obtained, then a portion of the complex base band signal is normalized in amplitude, and the normalized signal is synchronized with a PN code and the time reference is estimated. A frequency error is estimated from a complex correlation value used for the estimation of the time reference. The normalized signal is corrected corresponding to the estimated frequency error, and the corrected signal is used to estimate and correct the initial phase. The corrected signal and the time reference are used to estimate a time lag between a symbol point and the sample point nearest thereto and a reference signal displaced by the time lag is generated. The reference signal and the corrected signal are used to estimate the remaining frequency error and initial phase by the least squares method. All the estimated values are used to correct the signal b, and the corrected signal and the reference signal are used to calculate the waveform quality.

6 Claims, 8 Drawing Sheets

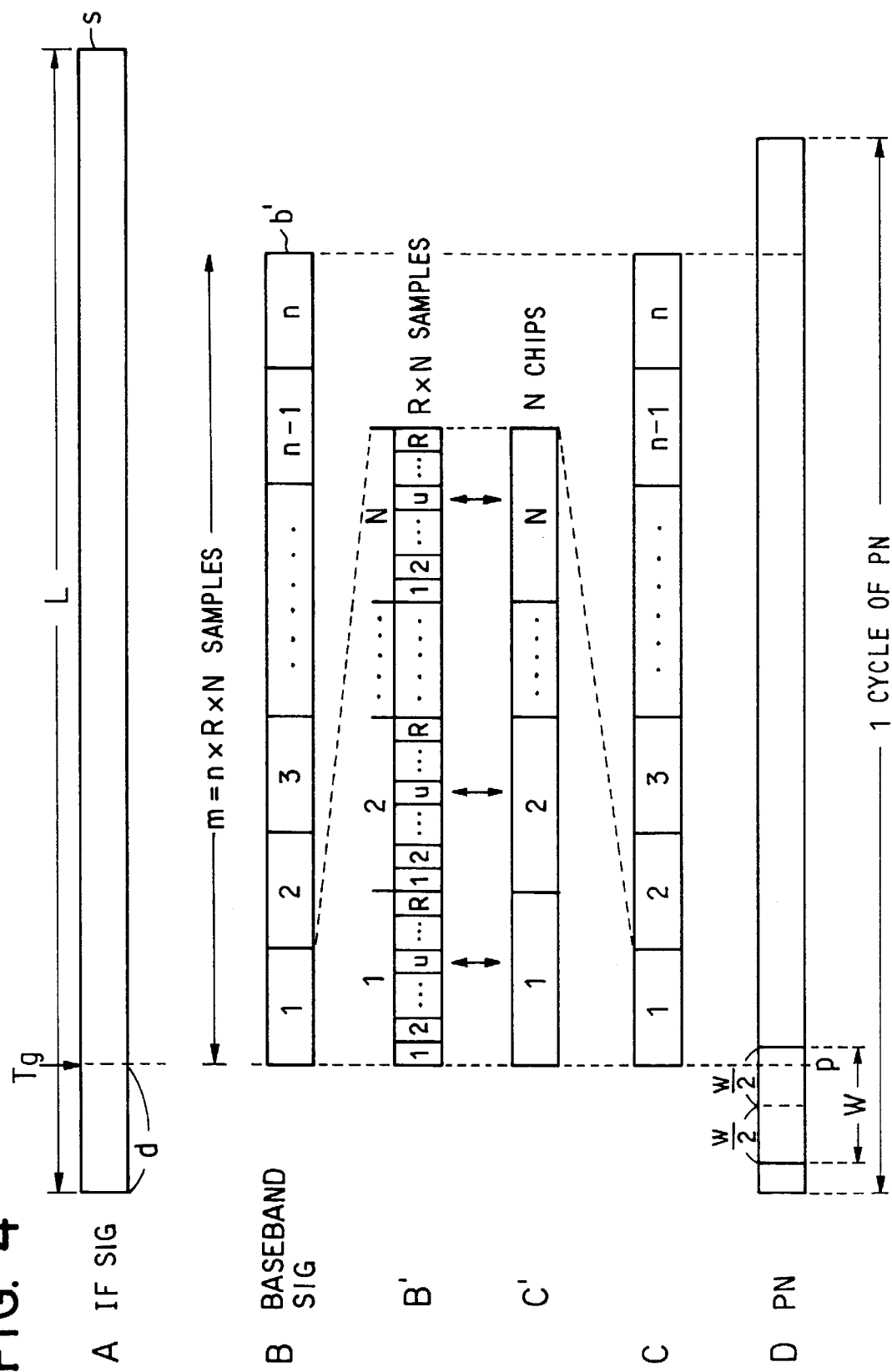

REF SIG GENERATOR 35

FREQ ERROR / PHASE
ESTIMATION 36

WAVEFORM QUALITY MEASURING METHOD AND APPARATUS

BACKGROUND OF THE INVENTION

The present invention relates to a method and apparatus for measuring the waveform quality of signals that are transmitted from mobile stations of, for example, a mobile radio communication system using the CDMA scheme.

The standardization of a digital cellular system using the CDMA scheme is now proceeding in Subcommittee (TR45.5) of TIA/EIA under the leadership of Qualcomm, Inc. and standards for performance evaluations of transceivers are defined as IS-98 and IS-97. The present invention relates, in particular, to a method for measuring parameters of CDMA modulated mobile station send signals, such as a carrier frequency error, the carrier phase and the clock (symbol) phase (timing), and detecting therefrom the waveform quality defined in Standard IS-98 mentioned above.

There has already been proposed in U.S. patent application Ser. No. 08/825,502 entitled "Parameter Measuring Apparatus for Digital Quadrature Modulation Signals" (The corresponding Japanese patent application was not laid open to public inspection as of the priority date (Dec. 4, 1996) of this application.) a method for measuring, based on Standard IS-98, the waveform quality of mobile station send signals OQPSK (offset QPSK) modulated according to Standard IS-95. A description will be given first, with reference to FIG. 1, of the configuration of the apparatus.

The signal to be processed is down-converted to an IF signal, which is subjected to AD conversion by suitable sampling and stored as digital data in a memory. The IF digital signal is converted to a complex base band signal in a baseband converting part 11. The complex base band signal is input into a rough parameter estimating part 12, in which its parameter (the carrier frequency, for instance) is roughly estimated, then the thus estimated parameter is used to correct the complex base band signal in a correcting part 13, and the corrected base band signal is demodulated in a data detecting part 14. The demodulated data is provided via a time reference extracting part 15 to a reference signal generating part 16, wherein a reference signal is generated. The complex base band signal corrected in the correcting part 13 and the reference signal are used to estimate the parameter with high precision in a precise parameter estimating part 17. Finally, the complex base band signal corrected in the correcting part 13 is further corrected corresponding to the highly precise estimated value, and the resulting corrected signal and the reference signal are used to calculate the waveform quality in a waveform quality calculating part 19. The parameter estimation in the rough parameter estimating part 12 is made with such a degree of accuracy as to permit correct demodulation of the base band signal in the data detecting part 14.

The conventional method involves the data demodulation to extract the time reference. To perform this, it is necessary to estimate the parameter to such an extent as not to cause a demodulation error and correct the complex base band signal accordingly prior to the data demodulation. Hence, the occurrence of a demodulation error will cause an error in the extraction of the time reference, introducing an error in the subsequent parameter estimation. Furthermore, the prior art method employs plural parameter estimating parts and, upon each parameter estimation, entirely corrects the complex base band signal. If the signal is long, the calculating time will increase accordingly.

SUMMARY OF THE INVENTION

It is therefore an object of the present invention to provide a waveform quality measuring method and apparatus which permit high precision, fast measurement of the waveform quality.

According to the present invention:

a first complex base band signal and a local code sequence are synchronized by time reference extracting/frequency error estimating means to obtain a first signal delay value and a first frequency error;

the first complex base band signal is corrected by frequency correcting means based on the first frequency error to obtain a second complex base band signal;

a first initial phase of a carrier is estimated by initial phase estimating means from the second complex base band signal;

the second complex base band signal is corrected by phase correcting means based on the first initial phase to obtain a third complex base band signal;

a second signal delay value, which is a time lag between a symbol point and the sample point nearest thereto, is estimated by symbol point estimating means from the third complex base band signal, the first signal delay value and the local code sequence;

a reference signal, which has a time lag of the second signal delay value relative to the sample point, is generated by reference signal generating means from the first signal delay value, the second signal delay value and the local code sequence;

a second frequency error and a second carrier initial phase are estimated by frequency error/initial phase estimating means from the reference signal and the third complex base band signal; and the first complex base band signal is corrected by frequency error/initial phase correcting means based on the first and second frequency errors and the first and second initial phases to obtain a corrected base band signal.

BRIEF DESCRIPTION OF THE DRAWINGS

FIG. 4 is a timing chart showing the processing timing relationship between an input signal and a PN sequence;

DETAILED DESCRIPTION OF THE PREFERRED EMBODIMENTS

Figure 1:
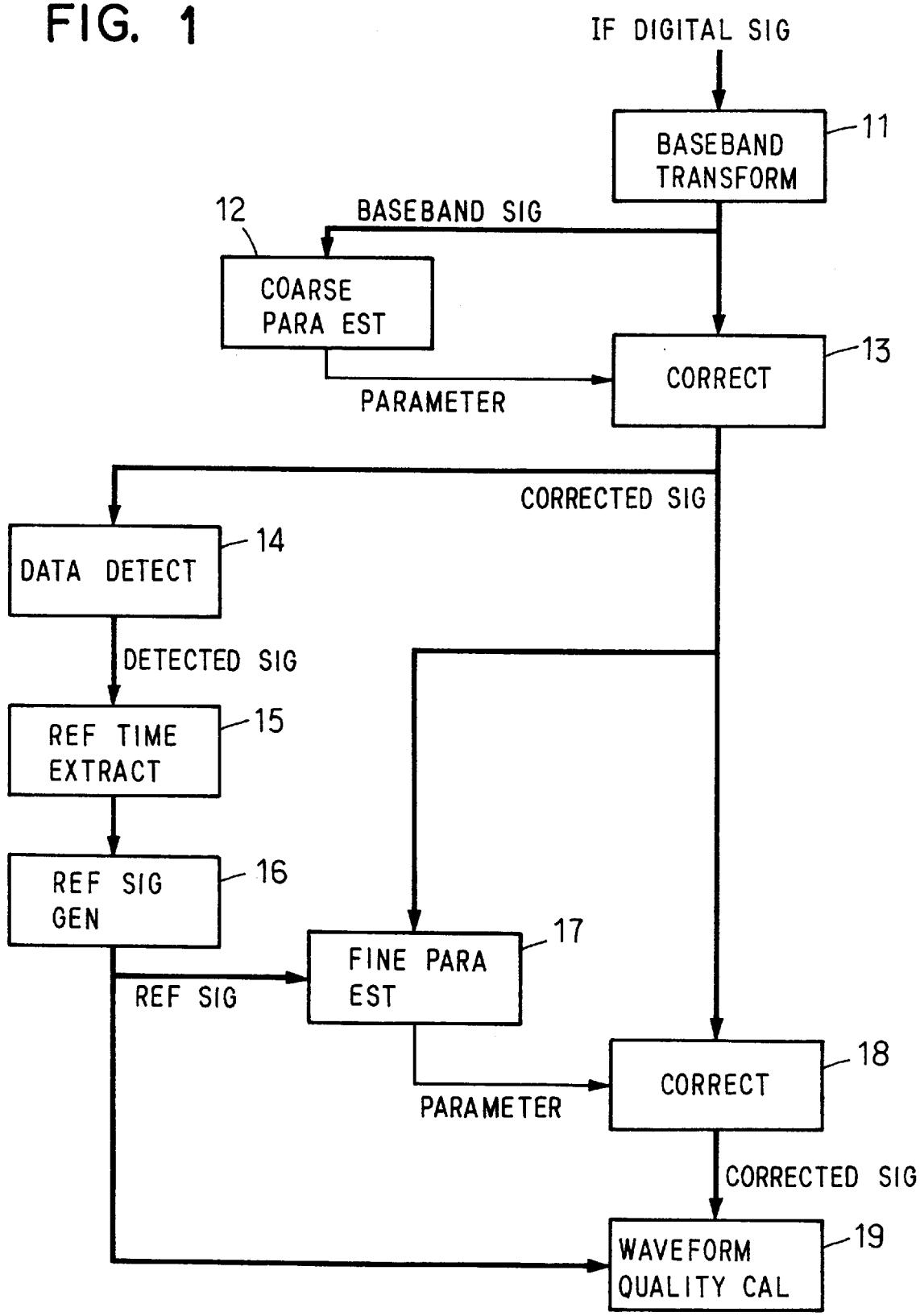
FIG. 1 is a block diagram illustrating the functional configuration of an apparatus employing a conventional waveform quality measuring method.
Figure 2:
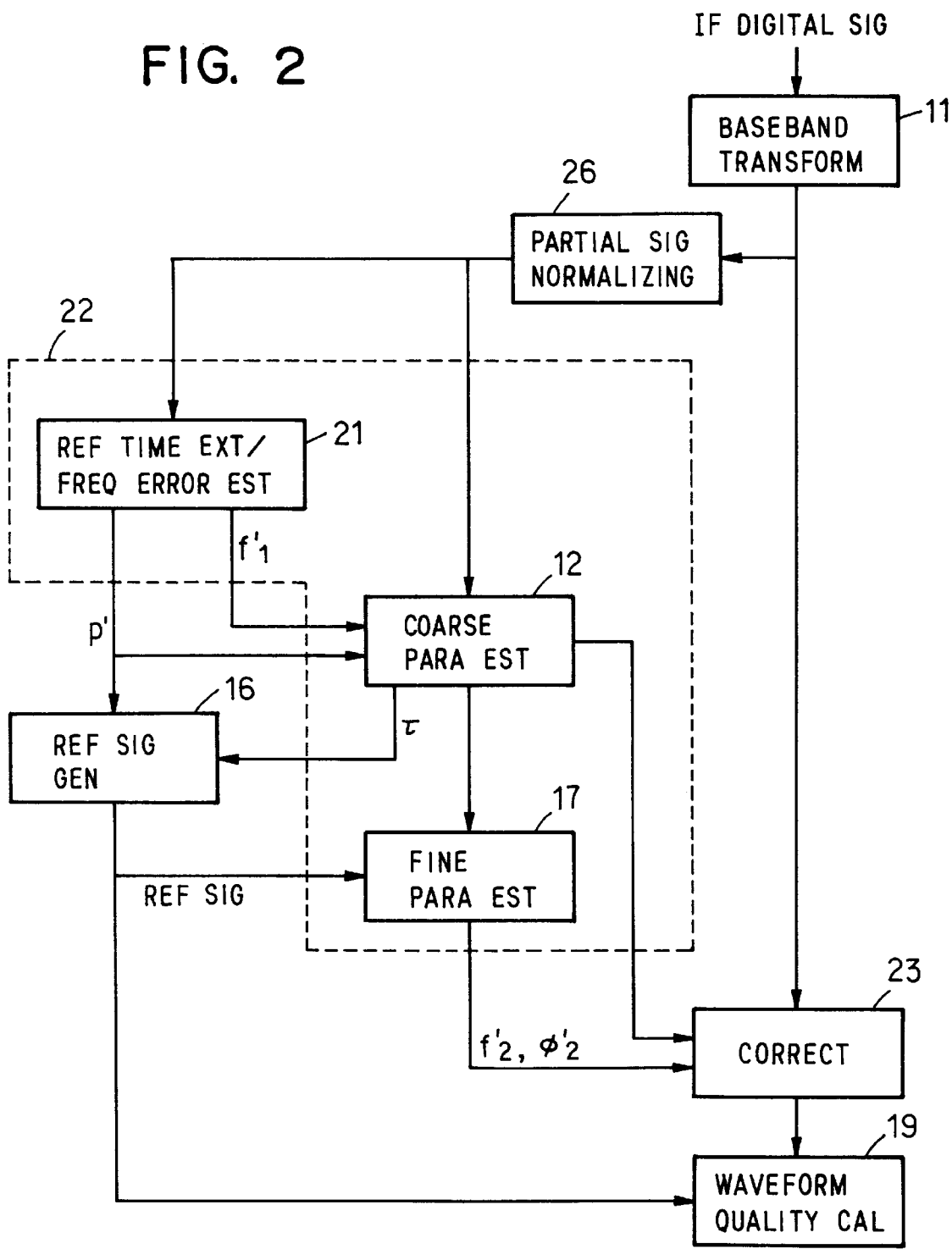
FIG. 2 is a block diagram illustrating the functional configuration employing the basic design of this invention method.

FIG. 2 illustrates in block form the functional configuration for waveform quality measurement according to the present invention. In the present invention, too, the signal to be measured (an input signal) is down-converted to an IF signal and an IF digital signal, obtained by AD conversion of the IF signal is read out of a memory not shown and applied to the baseband converting part 11, wherein it is converted to a complex base band signal. According to the present invention, the complex base band signal is input into a time reference extracting/frequency error estimating part 21, wherein it is synchronized with a PN sequence (a pseudo random code sequence) at high speed by dividing the former to plural partial signals; by this, the time reference is extracted and, at the same time, a frequency error contained in the input signal is also estimated. With this method it is possible to synchronize the partial signals with the PN code sequence even if the frequency error is contained in the input signal to some extent and to extract the time reference without involving data demodulation.

A portion of the output from the baseband converting part 11 is extracted as a parameter estimating signal via a partial signal normalizing part 26 and this partial signal is used to estimate all parameters in a parameter estimating part 22. In the parameter estimating part 22 only this partial signal is corrected by an estimated value. That is, in the reference time extracting/frequency error estimating part 21 the partial signal is synchronized with the PN sequence to estimate a frequency error $f_1$ as well as the phase p' of the PN sequence. And the estimated frequency error $f_1$ is used to roughly correct the frequency of the partial signal in the rough parameter estimating part 12, then the carrier initial phase is estimated from the corrected partial signal and is also roughly corrected. From such a roughly corrected partial signal and the phase p' of the PN sequence is detected a time lag τ between a symbol point and the sample point nearest thereto.

Based on the phase p' of the PN sequence and the time lag τ, the reference signal generating part 16 generates a reference signal. The precise parameter estimating part 17 uses the reference signal to estimate a fine frequency error $f'_2$ of the roughly corrected partial signal and its phase $\phi'_2$ and provides them to a correcting part 23. The correcting part 23 corrects the original input signal, using the estimated parameters $f'_2$ and $\phi'_2$. This will exclude the influence of an extension of the measuring range on the parameter estimating time.

As described above, according to the present invention, a portion of the output from the base band converting part is extracted as a parameter estimating signal via the partial signal normalizing part. This partial signal is used to estimate all parameters in the parameter estimating part, and during the parameter estimation only this partial signal is corrected by an estimated value. And finally the original input signals are all corrected corresponding to the parameters estimated so far.

Figure 3:
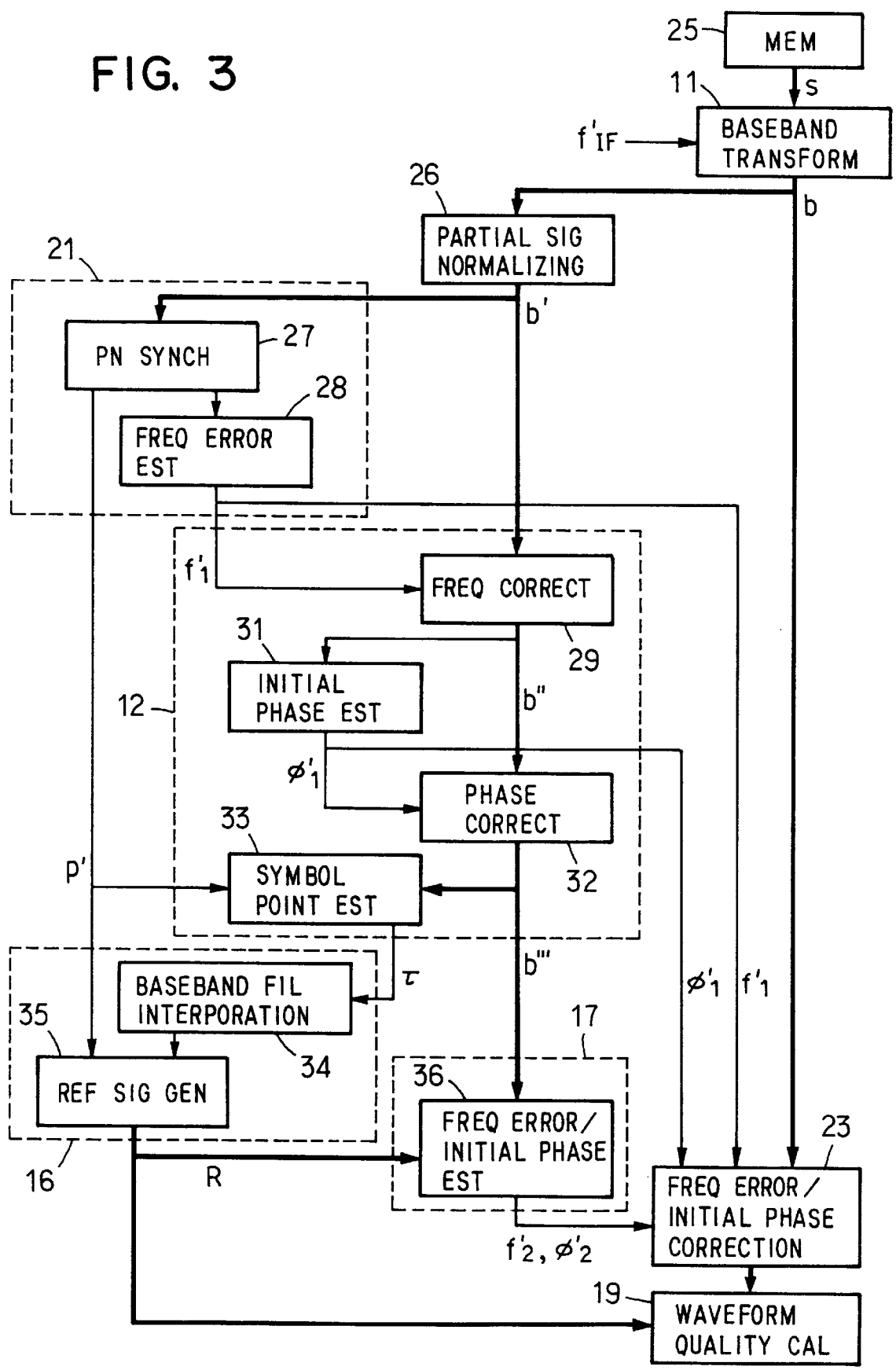
FIG. 3 is a block diagram illustrating the functional configuration of an apparatus embodying the present invention.

In FIG. 3 there is illustrated in block form the functional configuration of the measuring apparatus in accordance with an embodiment of the present invention. In FIG. 3, the thick lines indicate the flows of processing of the input signal to be measured and the PN sequence and the thin lines the flows of parameters. According to this embodiment, the waveform quality ρ of the test mode output signal of a CDMA (Standard IS-95) mobile station MS of Qualcomm, Inc. can be measured based on Standard IS-98. The input signal to be measured is a signal that is output from the mobile station MS in synchronization with a pilot signal that the mobile station MS receives from a base station BS defined by Standard IS-95 as is the case with the mobile station MS. Accordingly, the pilot signal from the base station BS is needed to obtain the output signal from the mobile station MS (the signal to be measured), but it can be substituted with a signal source capable of outputting the same signal as the pilot signal. The output signal from the mobile station MS is OQPSK modulated by always spreading data 0 with two PN sequences of the same rate as the symbol rate. In this embodiment the sampling rate R in the AD converter is chosen to be eight times higher than the symbol rate.

The output signal from the mobile station, that is, the signal to be measured (the input signal), is down-converted to a signal of an intermediate frequency $f_{IF}$ and A/D converted at a sampling rate eight times higher than the symbol rate $f_0$ in to an IF digital signal $S_{IF}$, which is stored in a memory 25. In the first place, an IF digital signal of an appropriate length is read out of the memory 25 at appropriate timing and input into the base band converting part 11, wherein it is converted by a local signal of the intermediate frequency $f_{IF}$ into a complex base band signal. The complex base band signal is applied to the partial signal normalizing part 26 and the frequency error/initial phase correcting part 23. In the partial signal normalizing part 26 a partial signal of an appropriate length is extracted from the complex base band signal and is normalized such that the average power is 1. Thereafter this normalized partial signal is used to estimated all parameters.

In a PN synchronizing section 27 in the time reference extracting/frequency error estimating part 21, the normalized partial signal is synchronized with a local PN sequence that will provide the maximum complex correlation, and the phase p' of the PN sequence used for spreading the data 0 and the sample point nearest to the symbol point are estimated. Next, in a frequency error estimating section 28 a frequency error is estimated from a complex partial correlation value used to decide the position of the PN synchronization, and in a frequency correcting section 29 in the rough parameter estimating part 12 the normalized partial signal is roughly corrected by the estimated frequency error $f_1$. Further, in an initial phase estimating section 31 the initial phase $\phi'_1$ of the carrier is estimated from the partial signal roughly corrected by the frequency error $f_1$ and in a phase correcting section 32 the roughly corrected partial signal is again roughly corrected by the estimated initial phase $\phi'_1$. In a symbol point estimating section 33 the time lag τ between the symbol point and the sample point nearest thereto is estimated from the signal roughly corrected by the estimated initial phase and the PN phase information p' obtained in the PN synchronizing section 27.

In a base band filter interpolating section 34 in the reference signal generating part 16, a calculation is made of an impulse response of a base band filter shifted by the time lag τ between the symbol point and the sample point nearest thereto. In a reference signal generating section 35 the impulse response shifted by t, the phase information of the PN sequence obtained in the PN synchronizing section 27 and a local PN sequence are used to generated a reference signal shifted by τ. In a frequency error/initial phase estimating section 36 of the precise parameter estimating part 17 the reference signal and the output signal from the phase correcting section 32 are used to precisely estimate the remaining frequency error $f'_2$ and the initial phase $\phi'_2$ of the carrier by the least squares method. In the frequency phase correction part 23 the original complex base band signal from the baseband converting part 11 is corrected using the two frequency errors f'$_1$, f'$_2$ and two carrier initial phases φ'$_1$, φ'$_2$ obtained in the frequency error estimating section 28, the initial phase estimating section 31 and the frequency error/initial phase estimating section 36 as described above. Finally, in a measurement item calculating part 19 the corrected signal and the reference signal are used to calculate waveform quality ρ and other measurement items. Each functional configuration will be described below.

Memory

The output signal from the mobile station MS, i.e. the signal that is sent from the mobile station MS (the signal to be measured, which will hereinafter be referred to also as MS signal), is output (transmitted) in synchronization with the pilot signal of the base station BS. The MS signal is first down-converted to the intermediate frequency f$_{IF}$, then A/D converted at a sampling rate eight times higher than the symbol rate f$_c$ and stored in the memory 25. The memory 25 is controlled by a trigger signal from the base station BS. The trigger signal is a signal representing the phase information of the pilot signal from the base station BS, that is, representing the head or beginning of the PN sequence. Hence, the phase information of the MS signal (the signal to be measured), which is output in synchronization with the pilot signal, can be known from the trigger signal. In practice, however, there is a time lag in outputting a signal from the mobile station MS after receiving the pilot signal from the base station BS. Accordingly, the data stored in the memory 25 at its trigger position is actually shifted by that time lag. The value of this time lag is one of the measurement items defined by Standard IS-98 (Time Alignment Error). In this embodiment, the position of the trigger signal is set a ½ chip interval ahead of the beginning of the PN sequence.

Data Acquisition

To begin with, an IF input signal s (an IF digital send signal of the mobile station MS) is read in the memory 25 by a length of L samples starting at a position d samples ahead of the trigger as shown in FIG. 4, Row A. The position d ahead of the trigger depends on the range w of the local PN sequence (FIG. 4, Row D), over which a search is conducted when the partial signal is synchronized with the PN sequence in the PN synchronizing section 27, and on the tap number T of a low-pass filter that is used to convert the IF digital input signal s to the base band. For example, assuming that the search is conducted within the range of w=100 tips at the time of PN synchronization and that the tap number T of the low-pass filter used for conversion to the base band is 55, the position d is ahead of the trigger by d={8w+(T−1)}/2=8×100/2+(55−1)/2=427 samples. This is because the waveform quality ρ, which the present invention is intended to measure, is always calculated using a waveform derived from a specific phase (at the beginning position of the PN sequence) of the input signal. The length L of the data to be read in the memory 25 depends on the length r for calculating the waveform quality ρ, the tap number T of the low-pass filter and the position d and it needs to satisfy the following relationship:

$$L \geq r + T - 1 + d + 8$$

Baseband Converting Part

Figure 5A:
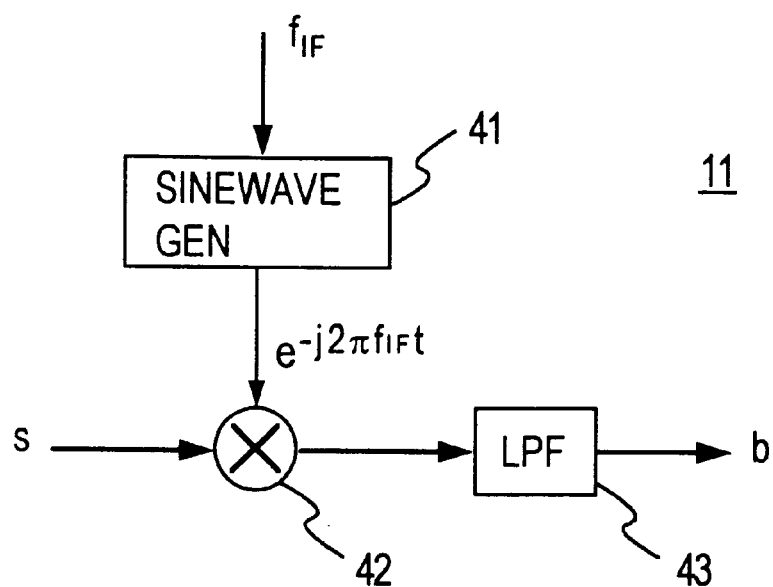
FIG. 5A is a block diagram showing the functional configuration of a baseband converting part 11 in FIG. 3.

The baseband converting part 11 converts the IF digital input signal s read out of the memory 25 to a complex base band signal b. To this end, as shown in FIG. 5A, the IF digital input signal s$_k$=s(kT$_s$) is multiplied in a multiplier 42 by a sine wave exp(−j2πf$_{IF}$kT$_s$) of the intermediate frequency fIF generated in a sine wave generating part 41 (where t=kT$_s$ is a discrete time and T$_s$ is a sampling interval) and the multiplied output is applied to a low-pass filter 43. In measurement standard (IS-98) it is defined that the input signal be passed through a band limiting filter defined in this standard prior to the calculation of the waveform quality. To meet this requirement, the low-pass filter 43 used in the baseband converting part 11 is formed by the band limiting filter, for example, a Nyquist filter of a tap number 55, a roll-off coefficient 0.26 and a sampling rate eight times higher than the symbol rate.

Partial Signal Normalizing Part

In the partial signal normalizing part 26, a signal of a length of m (<L) samples is extracted, as a signal for parameter estimation use, from the complex base band signal b at the position of the trigger Tg (FIG. 4, Row B) and this partial signal of the length m is normalized so that the average power is 1. That is, this normalized partial signal is used to estimate parameters by the functional configuration described below. In measurement standard (IS-98) the minimum measuring length ρ for calculating the waveform quality r, which is the measuring target of the present invention, is defined (615 chips). However, the estimation of the frequency error and various other parameters through the use of a signal of the defined length consumes much time because the signal is very long. To avoid this, a signal of the length m shorter than the defined minimum measuring length r is extracted from the complex base band signal and used for estimating parameters. (The estimation length m of the signal for parameter estimation is not defined.) This method permits fast parameter estimation. Since too short the parameter estimation length deteriorates the estimation accuracy, however, a trade-off between the estimation speed and the estimation accuracy is needed.

PN Synchronizing Section

Figure 6:
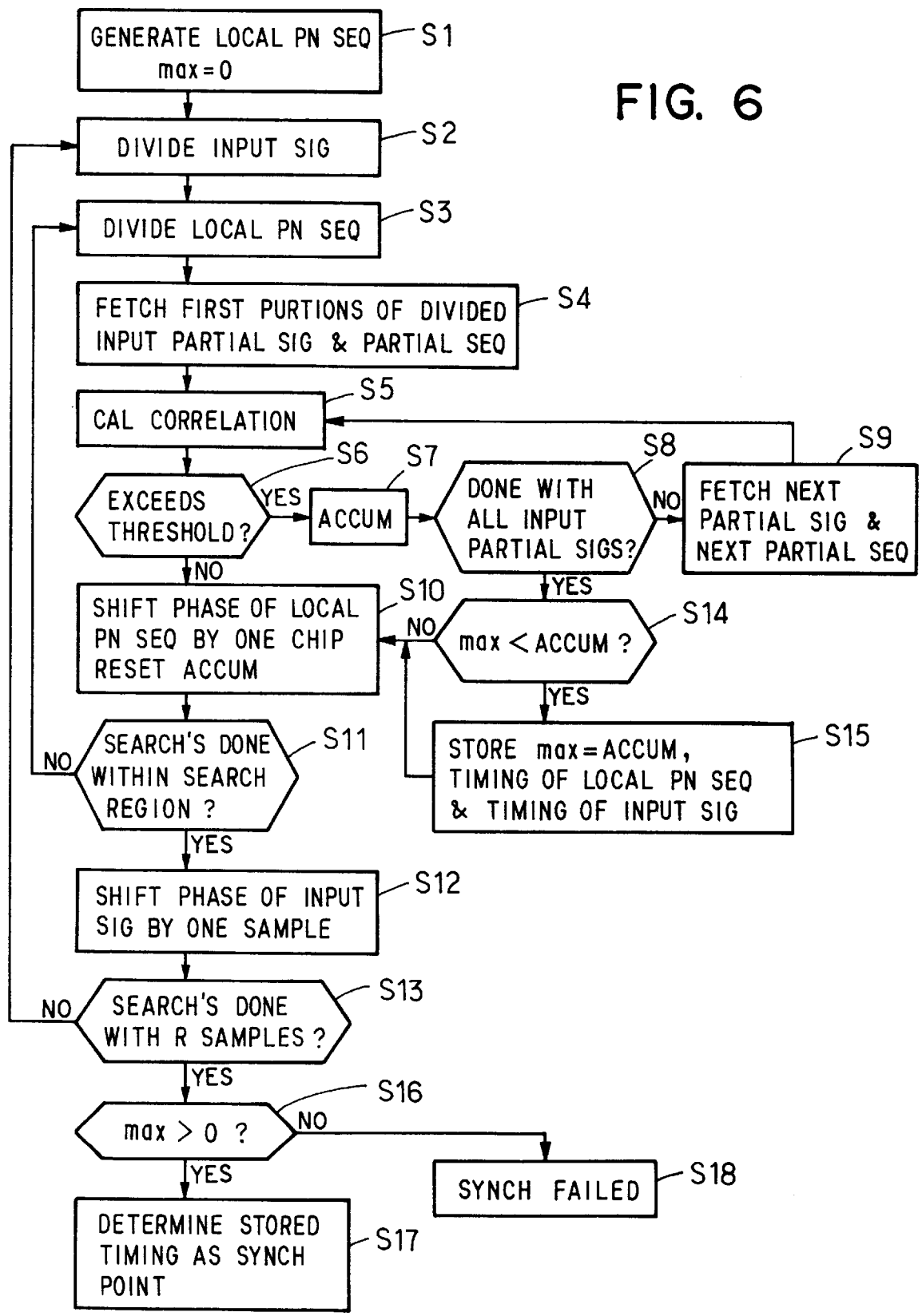
FIG. 6 is a flowchart showing an example of the procedure of processing by a PN synchronizing section 27 in FIG. 3.

The output signal b' from the partial signal normalizing part 26 is input into the PN synchronizing section 27, wherein the normalized signal b' of the length m is synchronized with the local PN sequence. By this, the phase of the PN sequence used for spreading and the position of the sample point nearest to the symbol point are found. To perform the PN synchronization at high speed, the range w of the local PN sequence (FIG. 4, Row D) over which to search is set shorter than one PN period. This is possible because a rough phase of the PN is known from the trigger signal Tg available from the outside. The following algorithm, shown in the FIG. 6 flowchart, is used to establish the above-said synchronization. In the following, initial values of integral variables u, Q and p are set at u=Q=p=1. The variable u is the sample number and varies such that u=1, 2, ..., R; Q is the partial signal number and varies such that Q=1,2, ..., n; and p is the chip number and varies such that p=1,2, ..., w.

S1: A local code sequence is generated and an accumulated value max is set at 0.

S2: The input signal b' of a sample length m=R×N×n is divided into very short sample sequences each having a length R×N and consisting of n partial signals (FIG. 4, Row B).

S3: A local PN code is divided into partial PN sequences each having a length N chips (FIG. 4, Row C).

S4: The first partial PN sequence (N chips) and the first partial signal (R×N samples) are extracted.

S5: N sample are extracted every R samples from the extracted partial signal, starting at a u-th sample(partly enlarged Row B'). The correlation value C given by the following equation is calculated between the N extracted pieces of sample data and the N chips of the partial PN sequence (partly enlarged Row C').

$$C_{u,Q,p} = |Z_{u,Q,p}| n/2N$$

where $$Z_{u,Q,p} = \Sigma(b'_{u+Qi} \cdot i_{i+p}) - j\Sigma(b'_{u+Qi+dR/2} \cdot q_{i+p}) \quad (1)$$

$\Sigma$: summation from i=N(Q-1) to NQ.

S6: A check is made to see if the correlation value $C_{u,Q,p}$ is in excess of a preset threshold value $\theta$.

S7: Where the correlation value $C_{u,Q,p}$ is in excess of the threshold value $\theta$, the accumulated value is accumulated.

S8: A check is made to see if the correlation has been calculated for every input partial signal.

S9: If not, the next partial signal and the next PN sequence are fetched (Q←Q+1) and the process goes back to step S5, wherein the correlation is calculated again.

S10: If it is found in step S6 that the correlation value is not in excess of the threshold value, the phase of the local PN sequence is displaced one chip, that is, p←p+1 and the accumulated value is reset.

S11: A check is made to see if a search has been conducted over the entire predetermined range w, that is, if p=w. If not, the process returns to step S3 and the local PN sequence displaced one chip in phase is subdivided or fragmented.

S12: After the phase of the local PN sequence is displaced one chip w-1 times (p=w) in step S11, the phase of the input signal b' is displaced one sample, that is, u←u+1.

S13: A check is made to see if the phase of the input signal b' has been displaced R-1 times, that is, if the search has been conducted from first to R-th samples. If not, the process returns to step S2. Accordingly, p is set at 1.

S14: When it is found in step S8 that the correlation has been calculated for every input partial signal, i.e. that Q=n, a check is made to see if the accumulated value obtained in step S7 is larger than the maximum value max so far. If not, the process proceeds to step S10.

S15: If it is found in step S14 that the accumulated value is larger than the maximum value max, the accumulated value is set as a new maximum value max, then the positions of the local PN sequence and the input signal at that time are recorded, and the process goes to step S10.

S16: When it is found in step S13 that the search of the input signal has been conducted from the first to R-th samples, that is, when the input signal b' has been displaced in phase R-1 times, a check is made to see if the value max at that time is positive.

S17: If the value max is positive, the positions recorded in step S15 are determined as the of point of establishment of synchronization.

S18: If the value max is not positive, it is decided that no synchronization has been established.

That is to say, steps S5 to S9 are repeated until the condition is satisfied that the threshold value is smaller than the correlation value, and when this condition is satisfied for all partial signals (until Q=n), the position at that time is a candidate for the position of PN synchronization. At this time, the leading position p of the local PN sequence, the leading position u of the data extracted from each partial signal, the sum of partial correlation values $\Sigma_Q C_{u,Q,p}$ and each complex partial correlation value $Z_{u,Q,p}$ are stored (S15). And the phase of the PN sequence is displaced one chip (p←p+1) and the operation is performed again starting at step S3.

If the threshold value becomes larger than the correlation value halfway through the operation, the phase of the PN sequence is displaced one chip (p←p+1) (S10) and the operation starting at step S3 is repeated.

Upon completion of the above calculation within the preset range for PN sequence search(until pew), the input signal is displaced one sample (u←u+1) (S12).

The phase of the PN sequence is returned to the initial phase (p=1) and the operation starting at step S2 is carried out again (S13). Since the input signal is sampled at a rate R times higher than the symbol rate, a chip point is always present within R samples. Hence, the position p' of the chip p that has the sum of the maximum correlation values, max $(\Sigma_Q C_{u,Q,p})_{u,p}$, at the point in time when the operation to step S13 was completed is decided as the head or beginning of the PN at the synchronization position, and the position u' of the sample u that has the sum of the maximum correlation values is decided as the leading sample point of a real part nearest to the symbol point.

Next, the complex partial correlation value $Z_{u,Q,p}$ will be described.

Modifying Eq. (1) of the complex partial correlation value $Z_{u,Q,p}$ with $b'_{u+8i} = x_{u+8i} + jy_{u+8i}$, we have $$Z_{u,Q,p} = \sum (x_{u+8i} + jy_{u+8i}) \cdot i_{i+p} - \quad (2)$$
$$j\sum (x_{u+8i+4} + jy_{u+8i+4}) \cdot q_{i+p}$$
$$= \sum (x_{u+8i} \cdot i_{i+p}) + \sum (y_{u+8i+4} \cdot q_{i+p}) +$$
$$j\{\sum (y_{u+8i} \cdot i_{i+p}) - \sum (x_{u+8i+4} \cdot q_{i+p})\}$$

where $\Sigma$ represents the summation from i=N(Q-1) to NQ.

First, consider the case where the input signal b' has no frequency error.

When the calculation of Eq. (2) is conducted at the synchronization position (u=u', p=p'), the real parts (first and second terms) of Eq. (2) are auto-correlations and takes large values. On the contrary, the imaginary parts (third and fourth terms) are cross-correlations and take values close to zero. Hence, the correlation value C that is a normalized version of the absolute value of the complex partial correlation value is large. When the calculation of Eq. (2) is conducted at other positions (u≠u', p≠p') than the synchronization position, all the terms become cross-correlations and take values close to zero. Hence, their correlation value C is close to zero. Accordingly, the correlation value C is large at the synchronization position and close to zero at other positions. When the input signal has no frequency error, the position of synchronization can be determined using the correlation value C and an appropriate threshold value.

Next, consider the case where the input signal b' has a frequency error (f=φ/2π). The input signal b' is divided into very short sequences (8×N) when it is synchronized with the PN sequence. Hence, it can be considered that no phase variation is caused by a frequency error in one partial sequence. Therefor, the complex partial correlation value $Z'_{u,Q,p}$ at that time can be rewritten as given below. For convenience of description, suffixes u' and p' will be written as u and p, respectively.

$$Z'_{u,Q,p} = \sum (b'_{u+8i} \cdot i_{i+p}) - j\sum (b'_{u+8i+4} \cdot q_{i+1})$$
$$= \sum (r_{u+8i} \cdot i_{i+p}) \exp\{j\phi(u+8i)\} -$$
$$j\sum (r_{u+8i+4} \cdot q_{i+p}) \exp\{j\phi(u+8i+4)\}$$
$$= \sum (r_{u+8i} \cdot i_{i+p}) \exp\{j\phi(u+8NQ+a)\} -$$

-continued $$j\sum(r_{u+8i+4} \cdot q_{i+p})\exp\{j\phi(u+8NQ+a)\}$$
$$= Z_{u,Qp}\exp\{j\phi(u+8NQ+a)\}$$

where a is a parameter indicating which phase of the partial sequence is regarded as the phase of the sample and r is a normalized signal when the input signal has no frequency error. The absolute value of the complex partial correlation value $Z'_{u,Q,p}$ has nothing to do with the frequency error and the carrier initial phase. Hence, the signal containing a frequency error can also be synchronized with the PN code sequence, using the correlation value C. The same is true of the initial phase of the carrier.

The signal is divided into partial signals for the PN synchronization. This is intended to establish the PN synchronization at high speed through reduction of the computational complexities at positions other than the synchronization position, to exclude the influence of the frequency error on the PN synchronization and to estimate the frequency error by using the complex partial correlation value in the frequency error estimating section described below.

Frequency Error Estimating Section

In the frequency error estimating section 28 the frequency error $f'_1$ is estimated.

The frequency error estimating section 28 receives from the PN synchronizing section 27 the complex partial correlation value $Z_{u,Q,p}$ calculated at the position of synchronization. If the complex partial correlation value $Z_{u,Q,p}$ is calculated at the synchronization position, the real part of the correlation value $Z_{u,Q,p}$ takes a large value and the imaginary part takes a value close to zero. Hence, it can be assumed that the phase of the correlation value $Z_{u,Q,p}$ is equal (0°) for all Q's (all partial signals).

Therefore, $$\frac{Z'_{u,Q+1,p}}{Z'_{u,Q,p}} = \frac{Z'_{u,Q+1,p} \cdot \exp\{j\phi[u+8N(Q+1)+a]\}}{Z_{u,Q,p} \cdot \exp\{j\phi[u+8NQ+a]\}} = \frac{Z_{u,Q+1,p}}{Z_{u,Q,p}}\exp\{j8\phi N\}$$

By using $Z'_{u,Q,p}$ and $Z'_{u,Q+1,p}$, the frequency error $f_Q$ can be calculated as follows:

$$f_Q = \phi_Q/(2\pi) = \{1/(2\pi)\} \cdot \{1/(8N)\} \cdot \arg(Z'_{u,Q+1,p}/Z'_{u,Q,p}) \text{ [rad/sample] (3)}$$

Figure 5B:
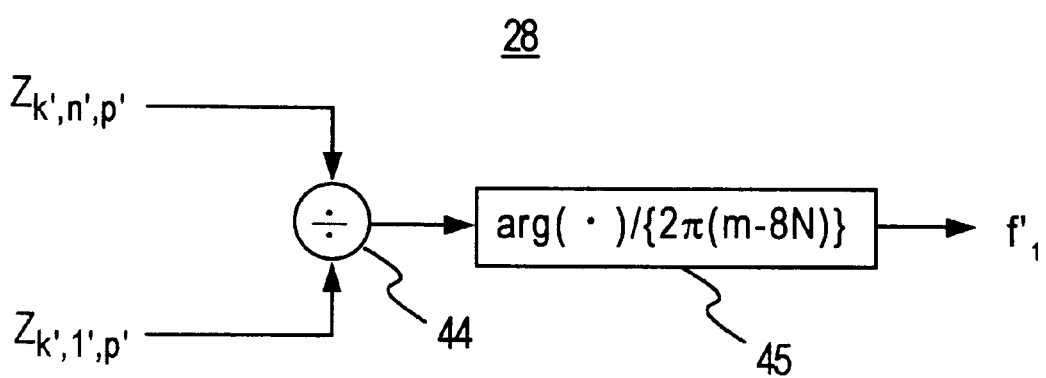
FIG. 5B is a block diagram showing the functional configuration of a frequency error estimating section 28 in FIG. 3.

Hence, the average value of the complex partial correlation value for all Q's can be calculated as the frequency error $f'_1$, as follows:

$$f'_1 = \{1/(n-1)\}\sum f_Q$$
$$= \{1/[2\pi(m-8N)]\}\sum \arg(Z'_{u,Q+1,p}/Z_{u,Q,p})\}$$
$$= \{1/[2\pi(m-8N)]\}\arg\{\prod(Z'_{u,Q+1,p}/Z'_{u,Q,p})\}$$
$$= \{1/[2\pi(m-8N)]\}\arg\{Z'_{u,n,p}/Z'_{u,1,p})\} \text{ [rad/sample]}$$

where $\Sigma$ and $\Pi$ each represent the summation and product from Q=1 to n-1, respectively. This value represents the amount of phase variation per sample. That is, as shown in FIG. 5B, $Z'_{u,n,p}$ is divided by $Z'_{u,1,p}$ in a dividing section 44 and arguments of the divided results is averaged in an averaging section 45 to obtain the frequency error $f'_1$. For example, setting m=4608 samples (576 chips), N-4 and n=144, the estimation accuracy of the frequency error is about 30 Hz.

Setting the PN search width at 100 chips and the threshold value at 0.2, the synchronization can be established in approximately 65 ms by DSP (TMS320C31).

Frequency Correcting Section

Since the first symbol point u' and the first frequency error $f'_1$ of the normalized partial signal b' are detected in the PN synchronizing section 27 and the frequency error estimating section 28, the normalized partial signal b' is corrected by the detected frequency error $f'_1$ as follows:

$$b''_k = b'_{u'+k}\exp(-2j\pi f'_1 T_s k) \quad (4)$$

Carrier Initial Phase Estimating Section

Figure 7A:
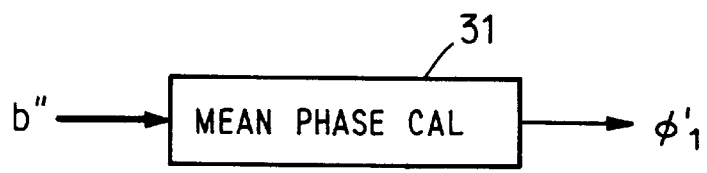
FIG. 7A is a diagram showing a concrete example of an initial phase estimating section 31 in FIG. 3.

In the initial phase estimating section 31 all the corrected normalized partial signals b", sampled at the sampling rate eight times higher than the symbol rate, are used to calculate an average phase $\phi'_1$ by the following equation, and this average phase $\phi'_1$ is used as the initial phase $\phi'_1$ of the carrier. This is shown in FIG. 7A.

$$\phi'_1 = \{1/(m-u')\}\Sigma \arg(b''_k)[\text{rad}] \quad (5)$$

where $\Sigma$ represents the summation from k=1 to m-u'.

Initial Phase Correcting Section

In the phase correcting section 32 the phase $\phi'_1$ estimated in the initial phase estimating section 31 and the output signal $b''_k$ from the frequency correcting section 29 are corrected by the following equation:

$$B'''_k = b''_k \exp(-j\phi'_1) \quad (6)$$

Symbol Point Estimating Section

Since the sample point nearest to the symbol point has been found in the PN synchronizing section 27, the remaining time lag $\tau$ (within ½ sampling interval) relative to the symbol point is estimated in the symbol point estimating section 33. To this end, the impulse response of the baseband filter defined in Standard IS-95 is approximated in advance as a quadratic expression of the time lag $\tau$ relative to the symbol point. This is, for example, the least squares method. The time lag $\tau$ is estimated as described below.

First, a logarithmic likelihood coefficient $\Lambda(\phi,\tau)$ is set as follows:

$$\Lambda(\phi,\tau) = Re[\exp(-j\phi)\int r(t)R^*(t-t)dt]$$

where r(t): input signal ($b'''_k$)

R(t): reference signal (OQPSK lowpass equivalent signal)

$$= \Sigma I_k g(t-kT_c) + j\Sigma Q_k g(t-kT_c-T_c/2)$$

g(t): baseband filter $T_c$: chip interval t: time lag $\phi$: initial phase of carrier T: measuring time And "*" represents a complex conjugate. The time lag $\tau$ is calculated such that the logarithmic likelihood function $\Lambda(\phi, \tau)$ is maximized. The requirements therefor are $\partial\Lambda/\partial\phi=0, \partial\Lambda/\partial\tau=0$ and the above equation is solved for $\tau$ with $\phi$ eliminated therefrom. First, from $\partial\Lambda/\partial\phi=0$, $$\partial\Lambda/\partial\phi = \partial\{Re[\exp(-j\phi)Z(\tau)]\}/\partial\phi$$
$$= 0.5\partial\{\exp(-j\phi)Z(\tau) + \exp(j\phi)Z^*(\tau)\}/\partial\phi$$
$$= 0.5\{-j\exp(-j\phi)Z(\tau) + j\exp(j\phi)Z^*(\tau)\}$$

-continued $$= 0$$

where $Z(\tau)=\int r(t)R^*(t-\tau)dt$. Therefore, $$\exp(-j\phi)Z(\tau)=\exp(j\phi)Z^*(\tau) \quad (7)$$

From $\partial \Lambda/\partial \tau$ $$\partial \Lambda / \partial \tau = \partial \{\text{Re}[\exp(-j\phi)Z(\tau)]\} / \partial \tau$$

$$= 0.5\partial \{\exp(-j\phi)Z(\tau) + \exp(j\phi)Z^*(\tau)\} / \partial \tau$$

$$= 0.5\{\exp(0-j\phi)\partial Z(\tau)/\partial \tau + \exp(j\phi)Z^*(\tau)\partial \tau\}$$

$$= 0$$

Thus $$\exp(j\phi)\partial Z^*(\tau)/\partial \tau = -\exp(-j\phi)\partial Z(\tau)/\partial \tau \quad (8)$$

Eqs. (7) and (8) are multiplied to obtain the following equation:

$$Z(\tau)\partial Z^*(\tau)/\partial \tau + Z^*(\tau)\partial Z(\tau)/\partial \tau = 0$$

Modifying this, $$Re\{Z(\tau)\partial Z^*(\tau)/\partial \tau\}=0 \quad (9)$$

Accordingly, $\tau$ is calculated in a manner to satisfy Eq. (9). Here, $Z(\tau)$ is modified as follows:

$$Z(\tau) = \int^T r(t)R*(t-\tau)dt \quad (10)$$

$$= \int^T r(t)\left\{\sum_k I_k g(t-\tau-kT_c) - j\sum Q_k g(t-\tau-kT_c - T_c/2)\right\}dt$$

$$= T_s \sum r(iT_s)\left\{\sum I_k g(iT_s-\tau-kT_c) - j\sum Q_k g(iT_s-\tau-kT_c - T_c/2)\right\}$$

$$= T_s \sum r(iT_s)\left\{\sum I_k g([i-8k]T_s-\tau) - j\sum Q_k g([i-8k-4]T_s-\tau)\right\}$$

$$= T_s \sum r(iT_s)\left\{\sum I_k g([8k-i]T_s+\tau) - j\sum Q_k g([8k-i+4]T_s+\tau)\right\}$$

$$= T_s\left\{\sum (mT_s+\tau)\sum r_{8k-m}I_k - j\sum g([m+4]T_s+\tau)\sum r_{8k-m}Q_k\right\}$$

where:
k=0 to k–1 (K being the number of demodulated data)
i=0 to (T/T$_s$)–1
m=–M to M
M: value when the tap number of the base band filter g(t) is (2M+1)
$r_{8k-m}=r([8k-m]T_s)$ In Eq. (10) for changing the integration to sum form, the sampling rate is $T_s=T_c/8$. Further, since the impulse response of the baseband filter is symmetric, g(t)=g(–t) is used. In order that Eq. (9) can be solved for $\tau$, the baseband filter g(mT$_s$+$\tau$) is approximated by a quadratic expression for $\tau$ as follows:

$$g(mT_s+\tau)=a_m+b_m\tau+c_m\tau^2$$

At this time, Eq. (10) is rewritten as follows:

$$Z(\tau) = T_s\left\{\sum (a_m + b_m\tau + c_m\tau^2)\sum r_{8k-m}I_k - j\sum (a_{m+4} + b_{m+4}\tau + c_{m+4}\tau^2)\sum r_{8k-m}Q_k\right\} \quad (11)$$

$$= T_s\left\{\left[\sum a_m \sum r_{8k-m}I_k - j\sum a_{m+4}\sum r_{8k-m}Q_k\right] + \left[\sum b_m \sum r_{8k-m}I_k - j\sum b_{m+4}\sum r_{8k-m}Q_k\right]\tau + \left[\sum c_m \sum r_{8k-m}I_k - j\sum c_{m+4}\sum r_{8k-m}Q_k\right]\tau^2\right\}$$

$$= T_s\{A + B\tau + C\tau^2\}$$

where:

$A=\Sigma_m a_m \Sigma r_{8k-m}I_k - j\Sigma a_{m+4}\Sigma r_{8k-m}Q_k$
$B=\Sigma_m b_m \Sigma r_{8k-m}I_k - j\Sigma b_{m+4}\Sigma r_{8k-m}Q_k$
$C=\Sigma_m c_m \Sigma r_{8k-m}I_k - j\Sigma c_{m+4}\Sigma r_{8k-m}Q_k$ Substitution of EQ. (11) into Eq. (9) gives $$Re[Z(\tau)Z^*(\tau)/\partial(\tau) = T_S^2 Re[(A+B\tau+C\tau^2)\partial(A^*+B^*\tau+C^*\tau^2)/\partial \tau]$$

$$= T_S^2 Re[(A+B\tau+C\tau^2)(B^*+2C^*\tau)]$$

$$= T_S^2 Re[A \cdot B^* + (|B|^2 + 2A \cdot C^*)\tau + (B^* \cdot C + 2B \cdot C^*)\tau^2 + 2|C|^2\tau^3]$$

$$= 0$$

Since $\tau$ is small, terms of second and higher degrees are ignored. Solving the above equation for $\tau$, $$\tau = -Re[A \cdot B^*]/\{|B|^2 + 2Re(A \cdot C^*)\}[\sec] \quad (12)$$

Figure 7B:
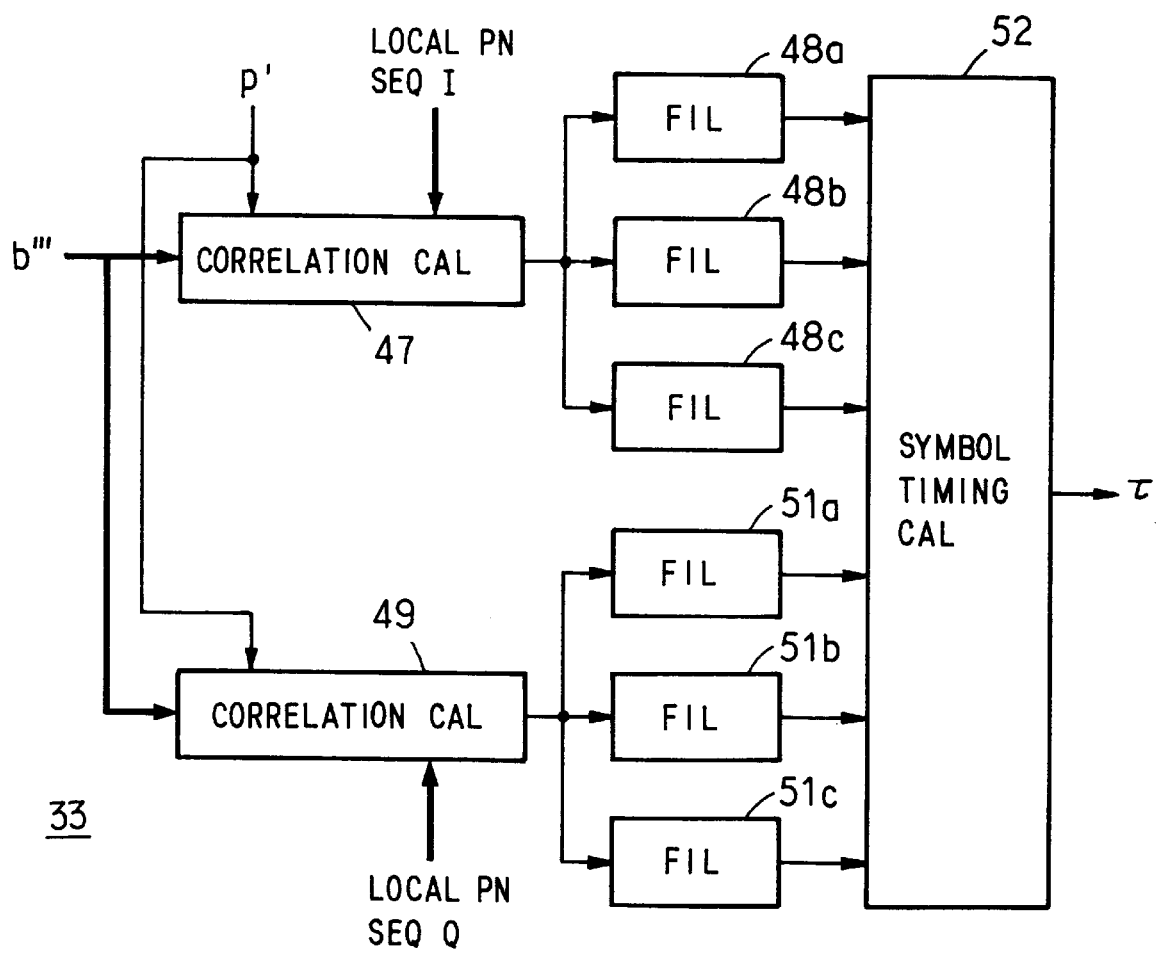
FIG. 7B is a block diagram showing an example of the functional configuration of a symbol point estimating section 33 in FIG. 3.

Turning next to FIG. 7B, the operation of estimating the symbol point will be described.

The value of cross-correlation between the corrected normalized partial signal b''' from the phase correcting section 32 and the local PN sequence is calculated in a cross-correlation calculating section 47 as follows:

$$\Sigma_k r_{8k-m}I_k$$

The calculated output is input into filters 48a, 48b and 48c of coefficients $a_m$, $b_m$ and $c_m$ (where m=–M to M), respectively. Similarly, The value of cross-correlation between the normalized partial signal b''' and a local PN sequence Q is calculated in a cross-correlation calculating section 49 as follows:

$$\Sigma_k r_{8k-m}Q_k$$

The calculated output is applied to filters 51a, 51b and 51c of coefficients $a_{m+4}$, $b_{m+4}$ and $c_{m+4}$ (where m=–M to M), respectively. In a symbol timing calculating section 52, A, B and C in Eq. (11) are calculated from the outputs of the filters 48a, 48b, 48c and 51a, 51b, 51c, and finally Eq. (12) is calculated to obtain $\tau$.

Baseband Filter Interpolating Section

In the baseband filter interpolating section 34, $\tau$ obtained in the symbol point estimating section 33 is substituted into the equation of the baseband filter approximated as a quadratic expression of $\tau$, by which is obtained an impulse response $h_k$ (where k=–M to M) displaced $\tau$ from the symbol point.

Reference Signal Generating Section

Figure 8A:
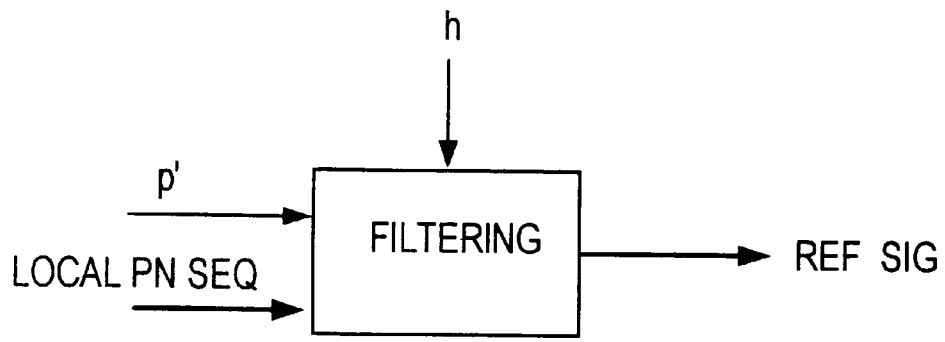
FIG. 8A is a block diagram showing the functional configuration of a reference signal generating section 35 in FIG. 3.

In the reference signal generating section 35, the local PN sequence and the τ-displaced impulse response of the baseband filter are used to create the reference signal R sampled at a sampling rate twice higher than the symbol rate, by the following calculation as shown in FIG. 8A.

$$R_i = \Sigma I_{p'+k} h_{4i-8k} + j\Sigma Q_{p'+k} h_{4i-8k-4}$$

where Σ represents the summation from k=−∞ to ∞. That is, the reference signal thus created is displaced τ from the symbol point. To calculate the waveform quality which the present invention is intended to obtain, it is necessary that the input signal and the reference signal have the same time lag. This can be accomplished by displacing the input signal by −τ or the reference signal by τ.

In the former case, the normalized partial signal b''' is displaced −τ by an interpolating filter first and then the reference signal is generated by the baseband filter containing the symbol point. In this instance, since the input signal that is displaced −τ was taken out for parameter estimation use, the original complex base band signal for measuring item calculation use also needs to be displaced −τ. In the latter case, the impulse response of the baseband filter is displaced τ and this displaced impulse response is used to produce the reference signal displaced τ from the symbol point. In this instance, the input is held unchanged.

The former scheme involves a total of three filtering operations, i.e. filtering for displacing a send signal for parameter estimation use, filtering for creating the reference signal and filtering for displacing the send signal for measuring item calculation use. In contrast thereto, the latter scheme involves only one filtering operation for creating the reference signal, and hence its computational load is small. For this reason, this embodiment adopts the latter scheme.

Frequency Error/Initial Phase Estimating Part

Figure 8B:
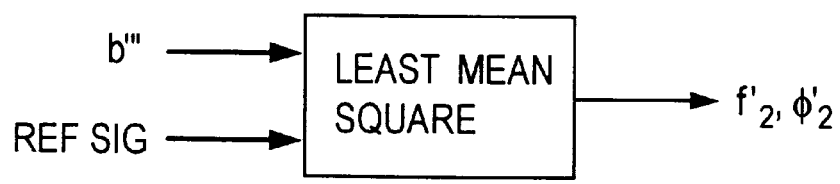
FIG. 8B is a block diagram showing an example of the functional configuration of a frequency error/phase estimating part 17 in FIG. 3.

The above-mentioned reference signal R and the normalized partial signal b''' corrected in the carrier initial phase estimating section 32 are used to estimate the remaining frequency error f'2 and the remaining initial phase $\phi'_2$ of the carrier by the least squares method as shown in FIG. 8B. This will be described below in concrete terms.

The least squares method is used to approximate the phase difference, $\phi_k = \arg(b'''_{4k}/R_k)$, between a signal to be measured, i.e. the corrected normalized partial signal b''', and the reference signal by a straight line of an intercept $\phi'_2$ and a slope $\Delta\phi'_2$ as follows:

$$E = \Sigma\{\phi_k - (\Delta\phi'_2 \cdot k + \phi'_2)\}^2 \quad (13)$$

where Σ represents the summation from k=1 to (m−u')/4.

From $\partial E/\partial \Delta\phi'_2 = 0$ and $\partial E/\partial \phi'_2 = 0$, the slope $\Delta\phi'_2$ and the intercept $\phi'_2$ are calculated. As a result, $$\Delta\phi'_2 = f'_2/2\pi = (1/2\pi) \cdot 6\{2A - B(m'+1)\}/$$
$$m'(m'+1)(m'-1) \quad [\text{rad/sample}]$$

$$\phi'_2 = \{2B(2m'+1) - 6A\}/\{m'(m'-1)\} \quad [\text{rad}]$$

where:

$$A = \sum_{k=1}^{m'} \phi_k k$$

$$B = \sum_{k=1}^{m'} \phi_k \quad m' = (m-u')/4$$

Frequency Error/Phase Correcting Part

The frequency errors $f_1$, $f_2$ and the initial phases $\phi'_1$, $\phi'_2$ obtained in the frequency error estimating section 28, the carrier initial phase estimating section 31 and the frequency error/initial phase estimating section 36 are used to correct the output signal B from the baseband converting part 11 by the following equation:

$$Z_k = b_{u'+k} \exp\{-j[2\pi(f'_1 + f'_2)T_s + \phi'_1 + \phi'_2]\}$$

Measuring Item Calculating Part

In the measuring item calculating part 19 the corrected send signal Z and the τ-displaced reference signal R are used to calculate the waveform quality p defined by Standard IS-98. In this case, the input signal and the reference signal are both always calculated by the following equation, starting at the PN.

$$\rho = \left|\sum_{k=1}^{r} R_k \cdot Z*_{4k}\right|^2 / \left\{\sum_{k=1}^{r} |R_k|^2 \cdot \sum_{k=1}^{r} |Z_{4k}|^2\right\}$$

Time Alignment Error Measurement

The MS signal is output in synchronization with the pilot signal from the base station BS. In practice, however, there is a time lag between the reception of the pilot signal by the mobile station MS and its outputting of the MS signal. Consequently, data stored in the memory 25 at the trigger position is out of or lags behind an ideal phase and this time lag is a time alignment error, which is one of the measuring items defined by Standard IS-98. This time lag value Δt is the difference between the distance a from the leading data of the IF signal read out of the memory 25 to the symbol point of the complex base band signal output from the baseband converting part 11 and the distance b from the phase of the leading PN obtained in the PN synchronizing section 27 and the phase ought to be at the leading position of the IF signal fetched from the memory 25. The time lag value Δt is calculated as follows:

ΔT=a−b [$t_s$ sec]
where:
a=(T−1)/2+u'+τ
b=(p'−w/2)·8+4

EFFECT OF THE INVENTION

As described above, the present invention extracts the time reference by synchronizing the complex base band signal and the local PN sequence and does not involve the demodulation of the complex base band signal in the parameter estimation. Hence, the invention precludes the possibility of a demodulation error causing serious errors in the parameter estimation, permitting measurement of the waveform quality with high accuracy accordingly. Besides, data of a length smaller than the data length necessary for measurement of the waveform quality is used to estimate all parameters, which are used to correct the complex base band signal; therefore, the measurement can be done in a shorter time than in the case of the conventional method that uses the whole data for parameter estimation.

It will be apparent that many modifications and variations may be effected without departing from the scope of the novel concepts of the present invention.

What is claimed is:

1. A waveform quality measuring method in which an input signal is converted to a digital signal, said digital signal is converted to a first complex base band signal, an error parameter in said first complex base band signal is corrected to obtain a corrected complex base band signal, and said corrected complex base band signal and a reference signal are used to measure the waveform quality of said input signal, said method comprising:

(a) a time reference extracting/frequency error estimating step of synchronizing said first complex base band signal and a local code sequence to obtain a first signal delay value and a first frequency error;

(b) a first correcting step of correcting said first complex base band signal based on said first frequency error to obtain a second complex base band signal;

(c) an initial phase estimating step of estimating a first initial phase of a carrier from said second complex base band signal;

(d) a second correcting step of correcting said second complex base band signal based on said first initial phase to obtain a third complex base band signal;

(e) a symbol point estimating step of calculating a second signal delay value, which is a time lag between a symbol point and a sample point nearest thereto, from said third complex base band signal, said first signal delay value and said local code sequence;

(f) a reference signal generating step of generating a reference signal, which has a time lag of said second signal delay value relative to said sample point, from said first signal delay value, said second signal delay value and said local code sequence;

(g) a frequency/initial phase estimating step of estimating a second frequency error and a second initial phase of said carrier from said reference signal and said third complex base band signal; and (h) a third correcting step of correcting said first complex base band signal based on said first and second frequency errors and said first and second initial phases of said carrier to obtain said corrected complex base band signal.

2. The method of claim 1, wherein said time reference extracting/frequency error estimating step, said first and second correcting steps, said initial phase estimating step and said symbol point estimating step are executed using that one portion of said first complex base band signal which has a data length shorter than that necessary for waveform quality measurement.

3. The method of claim 1, wherein the process of synchronizing said first complex base band signal and said local code sequence in said step (a) comprises the steps of:

(a1) dividing said first complex base band signal into n partial signals each having a predetermined number of samples, said n being an integer equal to or greater than 2;

(a2) dividing said local code sequence into partial code sequences each having a sequence length of N chips, said N being an integer equal to or greater than 2;

(a3) extracting a first one of said partial signals of said partial signal sequence and a first one of said partial code sequences;

(a4) calculating the value of correlation between said extracted partial signal and said exacted partial code sequence;

(a5) deciding whether or not said correlation value exceeds a threshold value;

(a6) accumulating said correlation value when it is decided in said step (a5) that said correlation value exceeds said threshold value;

(a7) deciding whether or not said calculation has been conducted for all of said n partial signals;

(a8) extracting the next partial signal and the next partial code sequence and returns to said step (a4) when it is decided in said step (a7) that said calculation has not been conducted for all of said n partial signals;

(a9) making a check to see if said accumulated value is larger than the maximum value so far when it is decided in said step (a7) that said calculation has been conducted for all of said n partial signals;

(a10) displacing the phase of said local code sequence by one chip and resetting said accumulated value when it is decided in said step (a9) that said accumulated value is not larger than said maximum value;

(a11) when it is decided in said step (a9) that said accumulated value is larger than said maximum value, setting said accumulated value as the maximum value, recording the positions of said local code sequence and said first complex base band signal at that time and proceeding to said step (a10);

(a12) making a check after said step (a10) to see if a search has been completed over a predetermined range, and if not, returning to said step (a2); and (a13) when it is decided in said step (a12) that said search has been completed over said predetermined range, deciding that synchronization has been established between said first complex base band signal and said local code sequence, if said maximum value is positive, and setting said recorded positions of said input signal and said local code sequence as the positions of their synchronization.

4. The method of claim 3, wherein said first complex base band signal is a signal sampled at a rate R times higher than the chip rate, R being an integer equal to or greater than 2; and wherein: in said step (a4), the values of correlation are calculated between N samples extracted from said extracted partial signals every R samples, starting at u-th sample and N chips of said extracted partial code sequence; when it is decided in said step (a12), that said search has been completed over said predetermined range, the phase of said first complex base band signal by one sample; a check is made in said step (a15) to see if said search has been completed over said predetermined range from first to R-th samples of said partial signal, and if not, said synchronizing process return to said step (a1), and if completed, said process proceeds to said step (a13).

5. The method of claim 1, wherein said code sequence is a PN code sequence.

6. A waveform quality measuring apparatus in which an input signal is converted to a digital signal, said digital signal is converted to a first complex base band signal, an error parameter in said first complex base band signal is corrected to obtain a corrected complex base band signal, and said corrected complex base band signal and a reference signal are used to measure the waveform quality of said input signal, said apparatus comprising:

time reference extracting/frequency error estimating means for synchronizing said first complex base band signal and a local code sequence to obtain a first signal delay value and a first frequency error;

frequency correcting means for correcting said first complex base band signal based on the first frequency error to obtain a second complex base band signal;

initial phase estimating means for estimating a first initial phase of a carrier from said second complex base band signal;

phase correcting means for correcting said second complex base band signal based on said first initial phase to obtain a third complex base band signal;

symbol point estimating means for estimating a second signal delay value, which is a time lag between a symbol point and a sample point nearest thereto, from said third complex base band signal, said first signal delay value and said local code sequence;

reference signal generating means for a reference signal, which has a time lag of said second signal delay value relative to said sample point, from said first signal delay value, said second signal delay value and said local code sequence;

frequency/initial phase estimating means for estimating a second frequency error and a second initial phase of said carrier from said reference signal and said third complex base band signal; and frequency error/initial phase correcting means for correcting said first complex base band signal based on said first and second frequency errors and said first and second initial phases to obtain said corrected complex base band. signal.

* * * * *

UNITED STATES PATENT AND TRADEMARK OFFICE
CERTIFICATE OF CORRECTION

PATENT NO.: 5,974,087
DATED : October 26, 1999
INVENTOR(S): Kenji NOWARA

It is certified that error appears in the above-identified patent and that said Letters Patent is hereby corrected as shown below:

| | |
|---|---|
| Col. 8, | line 4, change "pew" to --P=W--. |
| Col. 10, | line 51, change "+" to --τ--. |
| Col. 11, | line 15, delete "0" (second occurrence). |
| | line 20, delete "*" (second occurrence). |
| Col. 18, | line 9, delete "." (first occurrence). |

Signed and Sealed this

Fourth Day of July, 2000

Attest:

Q. TODD DICKINSON

*Attesting Officer*  *Director of Patents and Trademarks*